(12) United States Patent
Tatsumi

(10) Patent No.: US 9,825,709 B2
(45) Date of Patent: Nov. 21, 2017

(54) TRAVELING WAVE AMPLIFIER FOR DRIVING OPTICAL MODULATOR

(71) Applicant: SUMITOMO ELECTRIC INDUSTRIES, LTD., Osaka (JP)

(72) Inventor: Taizo Tatsumi, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/195,422

(22) Filed: Jun. 28, 2016

(65) Prior Publication Data

US 2016/0380699 A1    Dec. 29, 2016

(30) Foreign Application Priority Data

Jun. 29, 2015 (JP) ................................. 2015-129642

(51) Int. Cl.
*H03F 3/60* (2006.01)
*H04B 10/516* (2013.01)
*H03F 3/55* (2006.01)

(52) U.S. Cl.
CPC ............. *H04B 10/516* (2013.01); *H03F 3/55* (2013.01); *H03F 3/605* (2013.01)

(58) Field of Classification Search
CPC . H03F 3/60; H03F 3/605; H03F 3/607; H03F 2200/06; H03F 2200/09
USPC .......................................... 330/54, 286, 301
See application file for complete search history.

(56) References Cited

U.S. PATENT DOCUMENTS

| | | | | |
|---|---|---|---|---|
| 5,945,847 | A * | 8/1999 | Ransijn | ............ H03K 19/09432 326/112 |
| 8,742,851 | B2 * | 6/2014 | Jahanian | ............... H03F 1/3211 330/286 |

FOREIGN PATENT DOCUMENTS

| | | |
|---|---|---|
| JP | H9-130170 | 5/1997 |
| JP | H11-88079 | 3/1999 |
| JP | 2002-305419 | 10/2002 |
| JP | 2010-272918 | 12/2010 |
| JP | 2016-51975 | 4/2016 |

* cited by examiner

*Primary Examiner* — Steven J. Mottola
(74) *Attorney, Agent, or Firm* — Smith, Gambrell & Russell, LLP

(57) ABSTRACT

A traveling wave amplifier includes: a first line to transmit an input signal; an output-side line to transmit an output signal; amplifiers each having an input node and an output node, the input nodes being connected with the first line at first intervals and receiving the input signal, each of the amplifiers amplifying a signal input to the input node and outputting the amplified signal from the output node, the output nodes being connected with the output-side line at second intervals and generating the output signal; a second line to transmit another input signal having a phase opposite to a phase of the input signal; a first resistor having a first end connected with the first line and a second end; and a second resistor having a first end connected with the second line and a second end connected with the second end of the first resistor.

8 Claims, 16 Drawing Sheets

TRAVELING WAVE AMPLIFIER FOR DRIVING OPTICAL MODULATOR

FIELD OF THE INVENTION

The present invention relates to a traveling wave amplifier, particularly a traveling wave amplifier for driving an optical modulator.

BACKGROUND OF THE INVENTION

An optical transmitter module which converts an electric signal to an optical signal is used in optical communication systems. Particularly, an optical transmitter module used for long-distance transmission, for example for several tens of kilometers or more, includes a light source, an optical modulator for modulating CW light output from the light source, and a driving circuit for driving the optical modulator. Generally, a laser diode or the like is used as the light source, and an EAM (Electro Absorption Modulator), an MZM (Mach-Zehnder Modulator), or the like is used as the optical modulator.

DESCRIPTION OF THE BACKGROUND ART

For example, in an optical transmitter module for high speed communication of 28 Gbps or 40 Gbps, a rise time and a fall time in signal transition need to be less than 10 ps in an eye pattern of an optical output signal. Additionally, in a driving circuit for an optical modulator, input and output reflection coefficients (S parameters, S11 and S22) should be sufficiently suppressed up to a high frequency of about 40 GHz. Accordingly, a TWA (Traveling Wave Amplifier) having such high speed performance and low reflection coefficients is used for the driving circuit for the optical modulator (See Japanese Unexamined Patent Publication Nos. H9-130170, H11-88079, and 2010-272918).

SUMMARY OF THE INVENTION

A driving circuit for an optical modulator has been requested to enable not only a binary modulation system handling an NRZ (Non-Return to Zero) signal but also a multi-level modulation system handling a multi-level signal, such as PAM4 (4-level Pulse-Amplitude Modulation) or 16QAM (16-level Quadrature Amplitude Modulation).

The driving circuit may provide a flat frequency dependence of a gain, for example, up to about 30 GHz for PAM-n modulation (n is an integer) of a symbol rate of 32 Gbaud, or up to about 50 GHz for that of a symbol rate of 56 Gbaud.

Therefore, an aspect of the present invention is to provide a traveling wave amplifier which has such a flat frequency dependence of a gain up to high frequencies.

Specifically, a traveling wave amplifier according to one aspect of the present invention is a traveling wave amplifier to amplify an input signal and output the amplified input signal as an output signal. The traveling wave amplifier includes: a first input terminal configured to receive the input signal; a second input terminal configured to receive another input signal having a phase opposite to a phase of the input signal; an output terminal configured to output the output signal; a first input-side transmission line having a first end connected with the first input terminal and a second end; a second input-side transmission line having a first end connected with the second input terminal and a second end; an output-side transmission line having a first end connected with the output terminal; a plurality of amplification circuits, each of the amplification circuits having an input node and an output node, the input nodes of the amplification circuits being connected with the first input transmission line at first intervals in a predetermined order, each of the amplification circuits amplifying a signal input to the input node and output an amplified signal from the output node, the output nodes of the amplification circuits being connected with the output-side transmission line at second intervals in a predetermined order and generating the output signal, a first resistive element having a first end connected with a second end of the first input-side transmission line and a second end; and a second resistive element having a first end connected with a second end of the second input-side transmission line and a second end connected with the second end of the first resistive element.

DETAILED DESCRIPTION OF THE INVENTION

Figure 1:
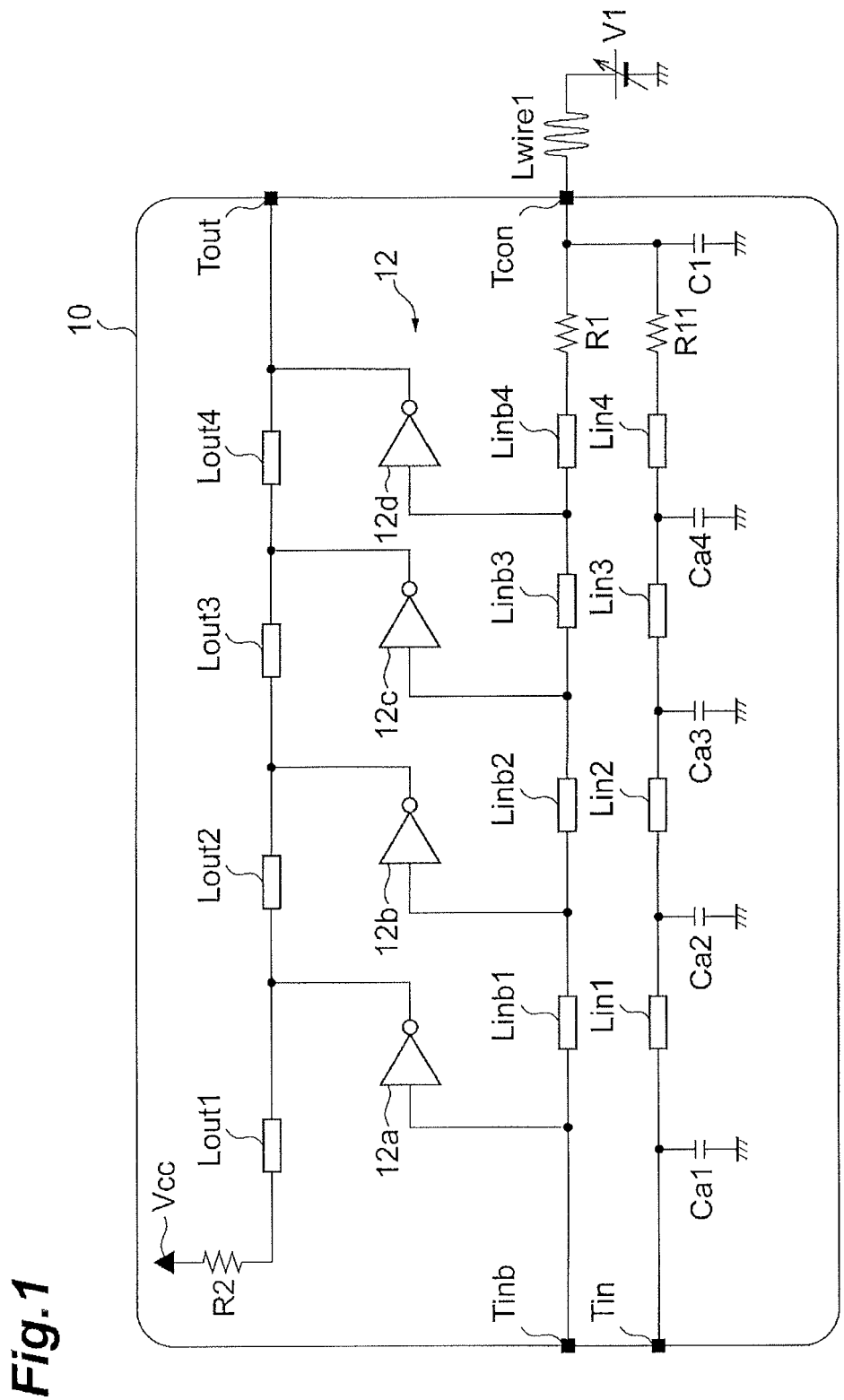
FIG. 1 is a circuit diagram of a traveling wave amplifier according to a preferred embodiment of the present invention.

Hereinafter, a traveling wave amplifier according to an embodiment of the present invention will be described in detail with reference to the accompanying drawings. It should be noted that identical reference numerals are assigned to identical elements in the description of the drawings, and duplicated description thereof is omitted.
[Configuration of Comparative Example]

First, description will be given of a traveling wave amplifier in a comparative example serving as a premise of the embodiment of the present invention.

Figure 10:
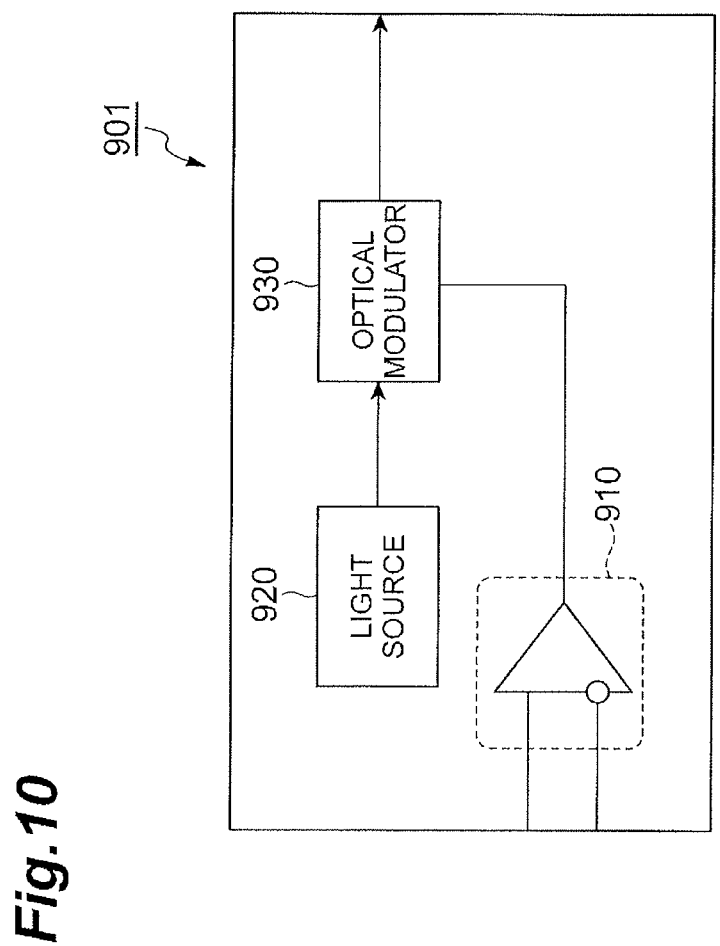
FIG. 10 is a block diagram illustrating a schematic configuration of an optical transmitter module, to which a traveling wave amplifier is applied.

FIG. 10 is a block diagram illustrating a schematic configuration of an optical transmitter module, to which the traveling wave amplifier of the comparative example is applied. As illustrated in FIG. 10, an optical transmitter module 901 includes a traveling wave amplifier 910, a light source 920, and an optical modulator 930. The optical transmitter module 901 is used for, for example, optical communication. The light source 920 outputs CW (Continuous Wave) light having a predetermined wavelength and a predetermined intensity (optical power). The light source 920 is, for example, a semiconductor laser diode. The optical modulator 930 modulates the CW light output from the light source 920. The optical modulator 930 is, for example, an EAM or an MZM. The traveling wave amplifier (TWA) is a driver for driving the optical modulator, 930. The optical modulator 930 is driven by the TWA 910 to modulate the CW light to generate an optical output signal. The optical output signal is input to an optical waveguide (not illustrated in FIG. 10) like an optical fiber cable for information communication.

The optical transmitter module 901 is used in a multi-level modulation system, such as PAM4 or 16QAM. The multi-level modulation system has been expected to enable the optical transmitter module 901 to perform high-speed modulation faster than modulation of a conventional optical transmitter module using a binary modulation system.

Specifically, for example, the optical transmitter module 901 has been needed to perform high-speed performance, for example operation at a high speed of 28 Gbps or 40 Gbps, for the multi-level modulation system in communication. For that purpose, as the driver for the optical modulator 930, the TWA 910 needs to amplify an electric signal of up to a high frequency of, for example, about 40 GHz. Additionally, in the optical transmitter module 901, a frequency characteristic of a gain of the TWA 910 should be flat up to the high frequency. More specifically, the frequency characteristic of the gain should be flat up to about 30 GHz in PAM-n modulation (n is an integer) of 32 Gbaud, and up to about 50 GHz in that of 56 Gbaud.

Figure 11:
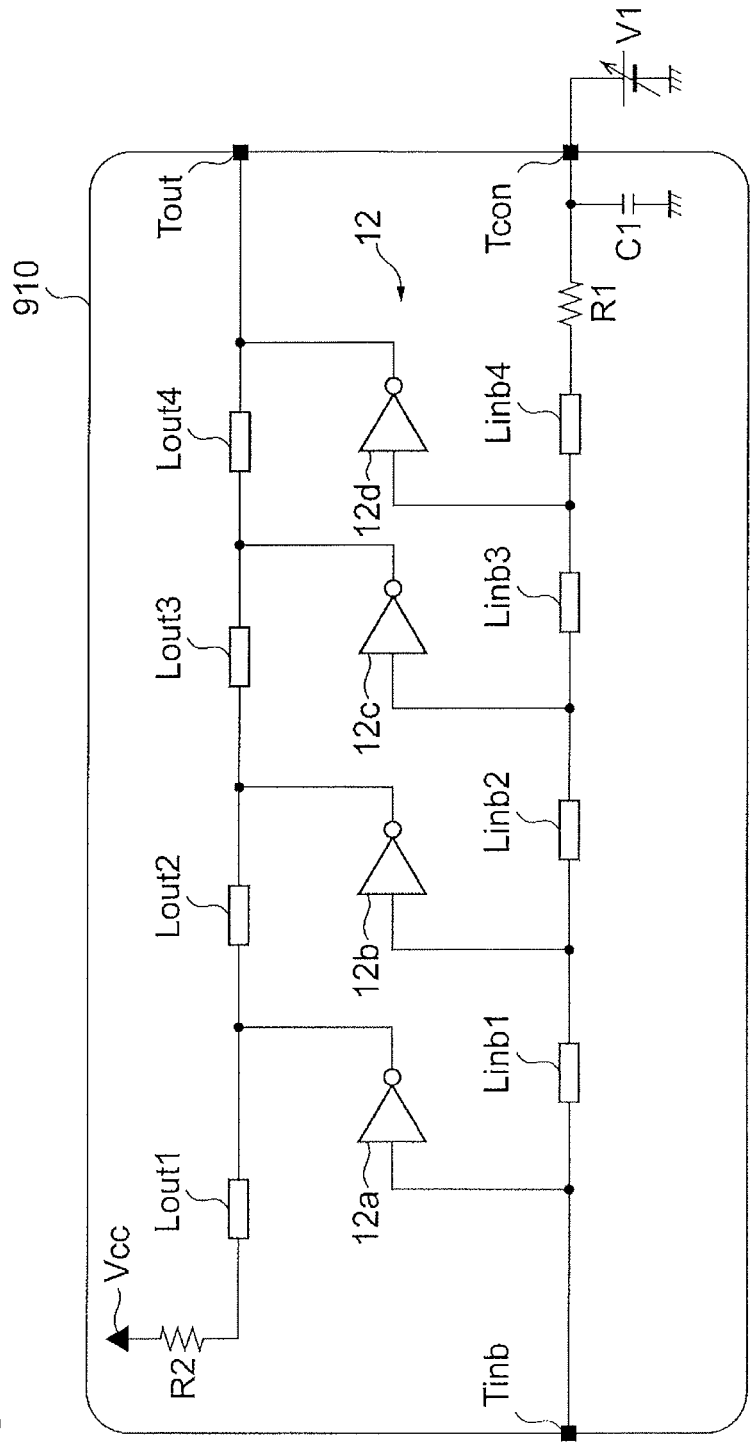
FIG. 11 is a circuit diagram of the traveling wave amplifier in FIG. 10.

FIG. 11 is a circuit diagram of the TWA 910 in FIG. 10.

As illustrated in FIG. 11, the traveling wave amplifier 910 is constituted of an input terminal Tinb, transmission lines Linb1 to Linb4 on input side, an amplification cell group 12 (an amplification circuit group) including amplification cells 12a to 12d (amplification circuits), transmission lines Lout1 to Lout4 on output side, an output terminal Tout, termination resistors R1 and R2, a capacitive element (a capacitor) C1, and a voltage control terminal Tcon. In the configuration illustrated in FIG. 11, the number of amplification cells is four (12a to 12d). However, the number of amplification cells may be two or more, and theoretically have no upper limit. For example, the number of amplification cells may practically be five or more. The number of the transmission lines on input side and transmission lines on output side can be appropriately changed according to the number of amplification cells. The transmission lines Linb1 to Linb4 on input side may constitute one longer transmission line (hereafter called first input-side transmission line). The first input-side transmission line may include four and more transmission lines on input side as described above. Similarly, The transmission lines Lout1 to Lout4 on output side may constitute one longer transmission line (hereafter called output-side transmission line). The output-side transmission line may include four or more transmission lines on output side as described above.

The input terminal Tinb is a terminal for receiving an electrical signal (an electrical input signal) according to a modulation system from outside (an input port of the input-side transmission lines). The input signal is, for example, a pulse voltage signal and includes a frequency component of up to, for example, about 40 GHz or 50 GHz.

The transmission lines Linb1 to Linb4 on input side are configured so that the four transmission lines Linb1, Linb2, Linb3, Linb4 are connected in cascade in that order. One end of the transmission line Linb1 on input side is connected with the input terminal Tinb to transmit the electrical input signal inside the TWA 910. The respective transmission lines Linb1 to Linb4 on input side can be, for example, configured by coplanar lines. However, a type of the transmission lines on input side is not particularly limited.

The input terminal Tinb is connected with an input node of the amplification cell 12a. One end of the transmission line Linb1 on input side is connected with the input terminal Tinb, and another end of the transmission line Linb1 on input side is connected with an input node of the amplification cell 12b. One end of the transmission line Linb2 on input side is connected with the other end of the transmission line Linb1 on input side, and another end of the transmission line Linb2 on input side is connected with an input node of the amplification cell 12c. One end of the transmission line Linb3 on input side is connected with the other end of the transmission line Linb2 on input side, and another end of the transmission line Linb3 on input side is connected with an input node of the amplification cell 12d. One end of the transmission line Linb4 on input side is connected with the other end of the transmission line Linb3 on input side, and another end of the transmission line Linb4 on input side is connected with one end of the termination resistor R1. Another end of the termination resistor R1 is connected with ground (GND) via the capacitive element C1 for stabilizing a termination potential at the other end of the termination resistor R1. The ground has a reference potential (e.g., 0 V). Further, the other end of the termination resistor R1 is also connected with the voltage control terminal Tcon.

Each of the amplification cells 12a to 12d (amplification circuits) includes an input node and an output node. Each of the amplification cells 12a to 12d amplifies a single-ended signal (single-ended input signal) input to the input node and outputs an amplified single-ended signal from the output node as a single-ended output signal. The electrical input signal input to the input terminal Tinb from the outside is divided to the respective input nodes of the amplification cells 12a to 12d at delay times different from each other. Details of the amplification cells 12a to 12d will be described below with reference to FIG. 12. As mentioned above, the input nodes of the amplification cells 12a to 12d are connected with different connecting points on the transmission lines Linb1 to Linb4 on the input side (a first input-side transmission line) at predetermined intervals in that order.

The output terminal Tout is a terminal for outputting the output signal generated by superposing the respective single-ended output signals output by the amplification cells 12a to 12d to the outside.

The transmission lines Lout1 to Lout4 on output side are configured so that the four transmission lines Lout1, Lout2, Lout3, Lout4 on output side are connected in cascade in that order. Another end (on a transmission line Lout4 side) of the transmission lines Lout1 to Lout4 on output side is connected with the output terminal Tout to transmit the single-ended output signals output from the amplification cells 12a to 12d to the outside. The transmission lines Lout1 to Lout4 on output side can be, for example, configured by coplanar lines, as well as the transmission lines Linb1 to Linb4 on input side. However, a type of the transmission lines on output side is not particularly limited.

One end of the transmission line Lout1 on output side is connected with one end of the termination resistor R2, and another end of the transmission line Lout1 on output side is connected with an output mode of the amplification cell 12a. Another end of the termination resistor R2 is connected with a power line Vcc. The power line Vcc has a power supply voltage for operating the amplification cells 12a to 12d. The power line Vcc may short-circuit the input signal and the output signal in high frequencies. At that time, the potential of the power line Vcc may be regarded as the ground for high-speed components of the input signal and output signal.

One end of the transmission line Lout2 on output side is connected with an output node of the amplification cell 12a, and another end of the transmission line Lout2 on output side is connected with one end of the transmission line Lout3 on output side. One end of the transmission line Lout3 on output side is connected with an output node of the amplification cell 12b, and another end of the transmission line Lout3 on output side is connected with one end of the transmission line Lout4 on output side. One end of the transmission line Lout4 on output side is connected with an output node of the amplification cell 12c, and another end of the transmission line Lout4 on output side is connected with the output terminal Tout. The output terminal Tout is directly connected with an output node of the amplification cell 12d. In this way, the output node of the amplification cells 12a to 12d are connected with different connecting points on the transmission lines Lout1 to Lout4 on output side (an output-side transmission line) at predetermined intervals in that order.

Next, operation of the TWA 910 illustrated in FIG. 11 will be described. In a certain aspect, as mentioned above, the electrical input signal input from the outside is, for example, the single-ended pulse voltage signal including the frequency components of up to about 40 GHz or 50 GHz. In this case, the TWA 910 can be a single-ended type amplifier.

The electrical input signals input to the input terminal Tinb is divided to the amplification cells 12a to 12d at respectively different delay times (phases) by passing through different paths in the transmission lines Linb1 to Linb4 on input side (the first input-end transmission line). It should be noted that, concerning the amplification cell 12a, a part of the electrical input signal directly reaches the amplification cell 12a from the input terminal Tinb without passing through the transmission lines Linb1 to Linb4 on input side. A difference between the delay times can be adjusted, for example, by changing an electrical length of the transmission line Linb1 on input side or the like. It should be noted that the remainder of the electrical input signal that has not been input to any of the amplification cells 12a to 12d is terminated by the termination resistor R1.

The amplification cells 12a to 12d respectively amplify parts of the electrical input signals that they receive as the single-ended input signal and respectively output the amplified single-ended signals as the single-ended output signals thereof. The single-ended output signals output by the amplification cells 12a to 12d reach (are transmitted to) the output terminal Tout at respectively different delay times (phases) by passing through different paths in the transmission lines Lout1 to Lout4 on output side (the output-side transmission line). Since the phases (delay times) of the electrical input signal input to the respective amplification cells 12a to 12d are different from each other, phases (delay times) of the output signals output from the respective amplification cells 12a to 12d to the output terminal Tout are also different from each other. Therefore, the delay times are adjusted so that the respective output signals from the amplification cells 12a to 12d have the same phase (namely are synchronized with each other) at the output terminal Tout. The delay times can be adjusted, for example, by changing an electrical length of the output-side transmission line Lout1 to Lout4.

The configuration and adjustment as described above enable the TWA 910 to amplify the electrical input signal input to the input terminal Tinb and output the amplified electrical signal from the output terminal Tout with suppressing the reflection of the high frequency components of the electrical input signal and output signal. Specifically, in the above description, the electrical input signal has been assumed to be a single-ended signal. However, in the other aspect, even when the electrical input signal is, for example, a differential signal, the TWA 910 may be adapted by replacing the single-ended type amplification cells with differential type amplification cells. In this case, for example, another set of an input terminal Tinb, transmission lines Linb1 to Linb4 on input side, transmission lines Lout1 to Lout4 on output side, termination resistors R1, R2, a capacitive element C1, and an output terminal Tout will be added to TWA 910 in FIG. 11 and the amplification cells 12a to 12d will be changed to differential type amplifiers. Such a configuration, allows the TWA 910 to amplify a differential potential (a differential input signal) between two input signals input from the input terminal Tinb and another added input terminal Tin, where the two input signals (a positive-phase input signal and a negative-phase input signal) have mutually opposite phases, and output the amplified differential potential as a differential output signal from the two output terminals. It should be noted that, for example, in a case where only a positive-phase component of the differential output signal (a positive-phase output signal) is used as a driving signal of the optical modulator, a configuration which output only the positive-phase component of the differential output signal from the output terminal Tout may be applied. In the configuration, a negative-phase component of the differential output signal (a negative-phase output signal) is connected with the termination resistor inside the TWA 910 and is not output to the outside. Therefore, in such case, the TWA 910 may include only one output terminal, namely the output terminal Tout.

Figure 12:
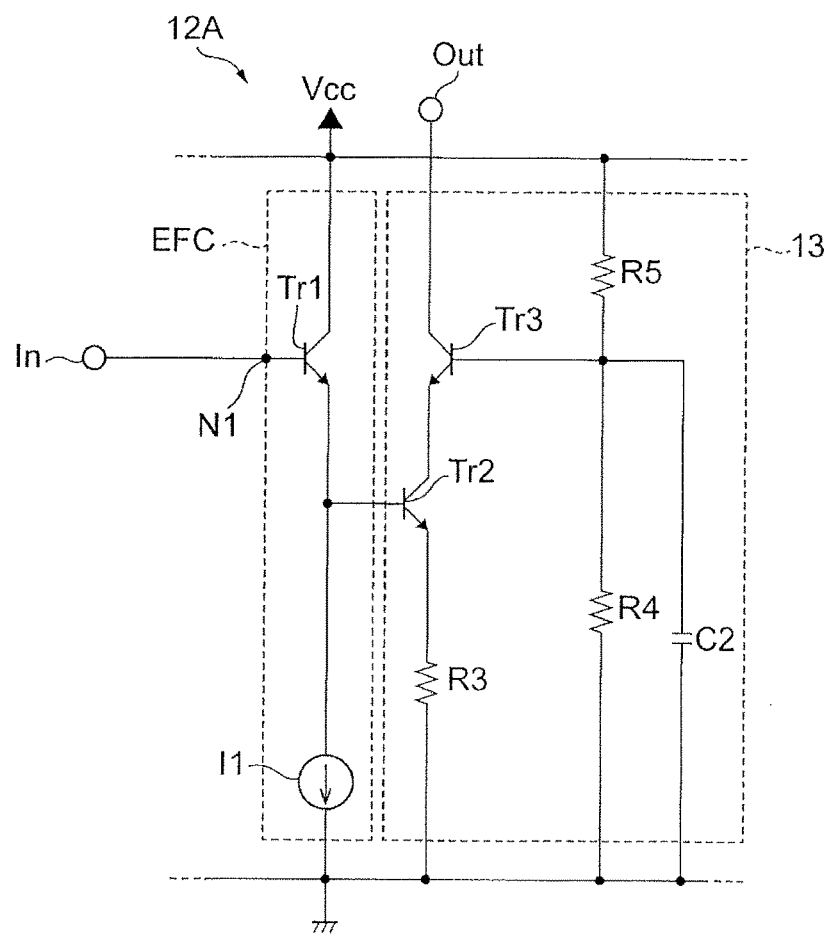
FIG. 12 is a circuit diagram illustrating an example of an amplification cell in FIG. 11.

Next, a configuration of the amplification cells 12a to 12d will be described with reference to FIG. 12. FIG. 12 is a circuit diagram illustrating an example of the configuration of the amplification cells 12a to 12d. A single-ended type amplification cell 12A is utilized in the example illustrated in FIG. 12.

As illustrated in FIG. 12, the amplification cell 12A is an amplifier (an amplification circuit) having an emitter follower at an input part. Specifically, the amplification cell 12A includes an input terminal In (input node), an emitter follower EFC (Emitter Follower Circuit), an amplification circuit 13, and an output terminal Out (output node).

The input terminal In is a terminal (a node) for receiving an input signal (single-ended input signal). The emitter follower EFC includes an input node N1, a transistor Tr1, and a current source I1. The input node N1 is connected with the input terminal In. The input node N1 is a terminal for receiving an input signal from the input terminal In.

A base (a control terminal) of the transistor Tr1 is connected with the input node N1, a collector (a first current terminal) thereof is connected with the power line Vcc, and an emitter (a second current terminal) thereof is connected with an input node of the amplification circuit 13 (for example, a base (a control terminal) of a transistor Tr2). The current source I1 is connected between the emitter (the second current terminal) of the transistor Tr1 and the ground to provide a current flowing from the emitter of the transistor Tr1 to the ground. Various types of known current source circuits configured by combining active elements such as semiconductor transistors and resistive elements such as resisters may be used as the current source I1.

The amplification circuit 13 includes transistors Tr2, Tr3, resistors R3 to R5, and a capacitor C2. The input node of the amplification circuit 13 (the base of the transistor Tr2) is connected with an output node of the emitter follower EFC (the emitter of the transistor Tr1). The amplification circuit 13 amplifies the signal input from the emitter follower EFC and outputs the amplified signal from the output terminal Out.

The base (the control terminal) of the transistor Tr2 is connected with the emitter of the transistor Tr1. An emitter (a second current terminal) of the transistor Tr2 is connected with the ground via the resistor R3. The transistor Tr3 is cascode-connected with the transistor Tr2. In other words, an emitter (a second current terminal) of the transistor Tr3 is connected with a collector (a first current terminal) of the transistor Tr2. A base (a control terminal) of the transistor Tr3 is connected with a connecting point between the resistor R4 and the resistor R5. The resistors R4, R5 are connected in series between the power line Vcc and the ground. The resistors R4, R5 constitute a voltage divider providing a potential V=R4/(R4+R5)*Vcc, where Vcc is power supply voltage. The capacitor C2 is connected between the ground and the connecting point between the resistors R4 and R5. The output terminal Out is a terminal (a node) for outputting an output signal. The output terminal Out is connected with a collector (the first current terminal) of the transistor Tr3.

Next, operation of the amplification cell 12A illustrated in FIG. 12 will be described. For example, in a case where the amplification cell 12A is used as the amplification cells 12a to 12d (FIG. 11), the electrical input signal transmitted along the first input-side transmission line (FIG. 11) is input to the input terminal In. The electrical input signal input to the input terminal Tinb from the outside is directly input to the amplification cell 12a.

The emitter follower EFC receives the electrical input signal from the first input-side transmission line (FIG. 11) via the input terminal In as the single-ended input signal. The single-ended input signal is transmitted to the amplification circuit 13 via the emitter follower EFC. Specifically, the single-ended input signal is input to the base (the control terminal) of the transistor Tr2 of the amplification circuit 13 from the base (the control terminal) of the transistor Tr1 via the emitter (the second current terminal) thereof. In the amplification circuit 13, the power supply voltage between the power line Vcc and the ground is divided by the resistors R4, R5 and applied to the base (the control terminal) of the transistor Tr3. The capacitor C2, for example, stabilizes a base potential of the transistor Tr3. The transistor Tr2 is driven by the single-ended input signal from the emitter follower EFC. The transistor Tr2 amplifies the single-ended input signal together with the cascode-connected transistor Tr3. The amplified single-ended input signal is output to the output terminal Out as a single-ended output signal. At this time, a DC potential of the base (the control terminal) of the transistor Tr2 is provided by a DC power supply V1 (FIG. 11) connected with the voltage control terminal Tcon via the transistor Tr1. Accordingly, a collector current Ic of the transistor Tr2 is controlled. In other words, an output current of the amplification cell 12A is adjusted by setting the voltage applied to the voltage control terminal Tcon. Thus, the amplification circuit 13 amplifies the single-ended input signal from the emitter follower EFC and outputs the amplified single-ended input signal to the output terminal Out as the single-ended output signal.

According to the above-described configuration and operation, the amplification cell 12A amplifies the single-ended input signal input to the input terminal In (input node) and outputs the amplified single-ended input signal to the output terminal Out (output node).

Figure 13:
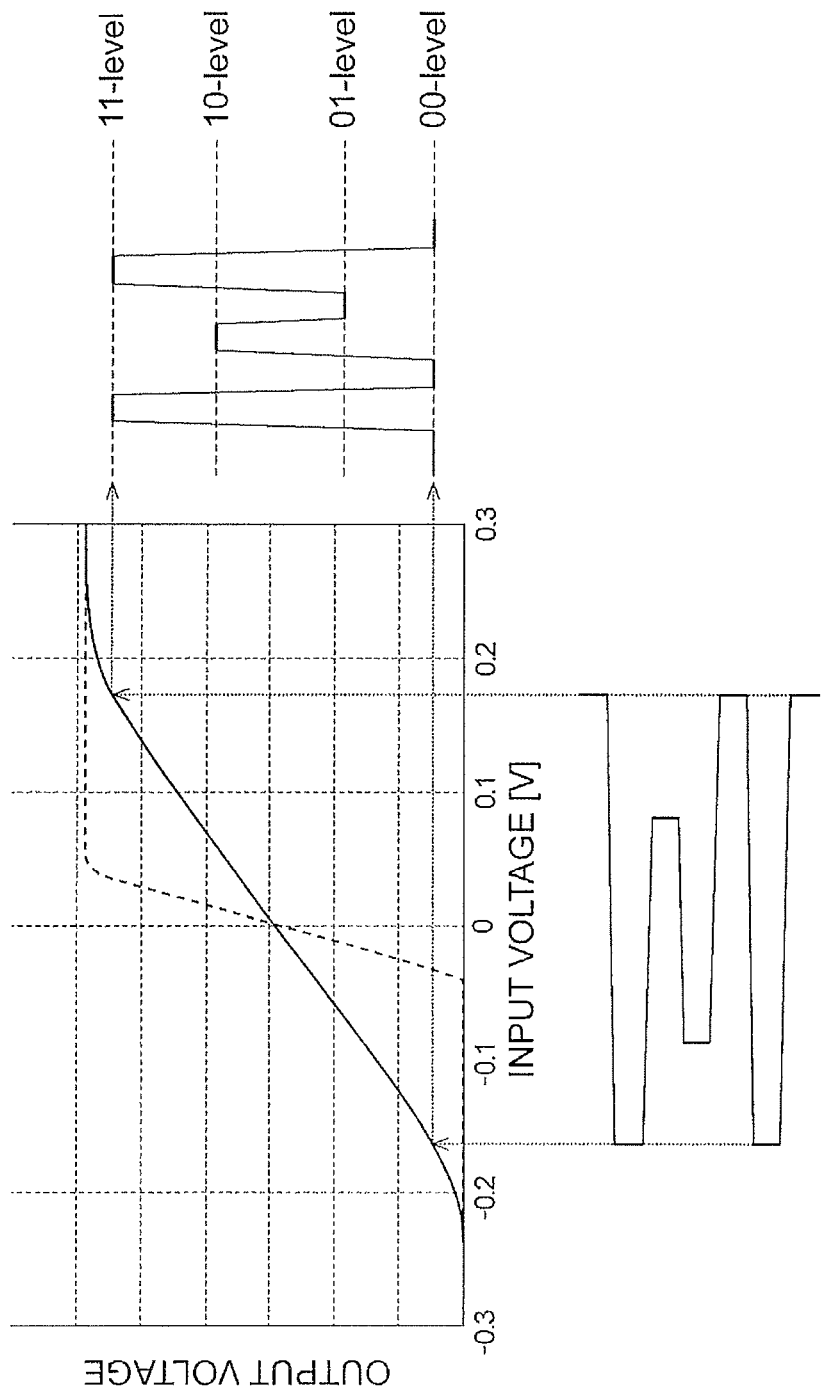
FIG. 13 is a graph illustrating input-output characteristics of the traveling wave amplifier in FIG. 10.

FIG. 13 is a diagram illustrating an input-output characteristic of the TWA 910. A dotted line represents a relationship between the input signal and the output signal when a limiting amplification is performed for a binary modulation system. The limiting amplification means amplification with limiting amplitude of an amplified signal. When the amplified signal is limited to a predetermined level, the amplified signal is distorted because the amplified signal does not change against an input signal. A solid line represents a relationship between the input signal and the output signal when a linear amplification is performed for a 4-level signal modulation system (PAM4). The linear amplification means amplification with maintaining linearity between an input signal and an amplified signal. In the linear amplification, for example, the amplified signal Vout has amplitude proportional to amplitude of the input signal Vin as described by a formula: Vout=A*Vin, where A is gain. In a multi-level signal modulation system, such as PAM4 or 16QAM, the driving circuit for the optical modulator 930 should perform a linear amplification. In the limiting amplification, respective binary signal levels (a "0" level and a "1" level) of the output signal are clipped to predetermined voltage levels relative to the input signal. Therefore, amplitude of the output signal is forced to be a difference between the two signal levels without depending on a gain. To the contrary, in the linear amplification, amplitude of the output signal depends on a product of the gain and amplitude of the input signal. Further, in the multi-level signal modulation system, a potential difference between the plurality of signal levels generally becomes small as compared with the binary modulation system. Generally, for an amplifier operating in a linear operation region (performing linear amplification), flatness in a frequency characteristic of a gain is important to prevent distortion. For example, the driving circuit for the PAM4 of 50 Gbaud requires flatness in which a variation of the gain is within about ±0.5 dB in a relatively wide range of about 100 MHz to about 30 GHz.

Figure 14:
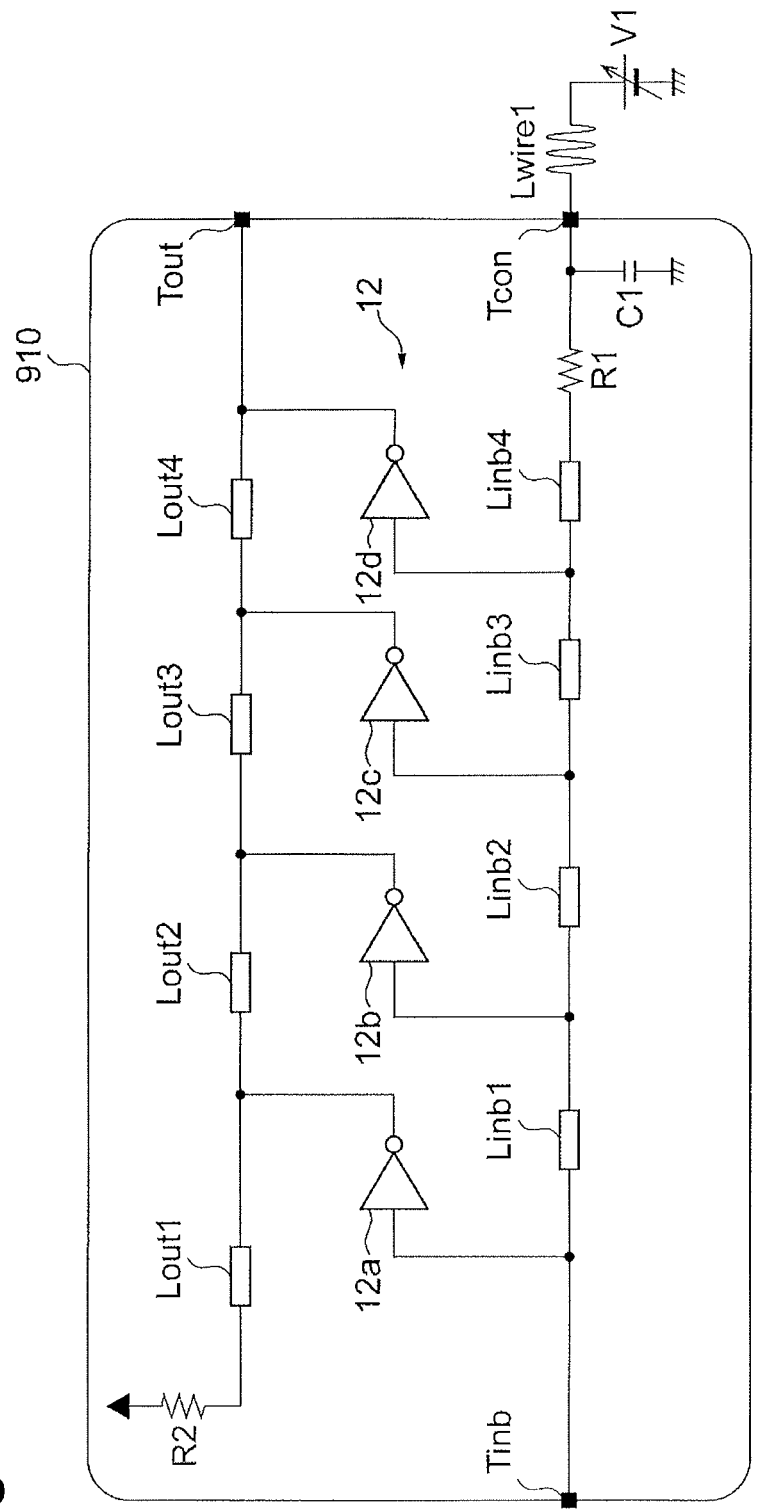
FIG. 14 is a circuit diagram of the traveling wave amplifier in FIG. 10.

As illustrated in FIG. 14, when the TWA 910 is actually mounted to inside of the optical transmitter module, a bonding wire which connects the voltage control terminal Tcon to the DC power supply V1 has a parasitic inductor Lwire1. Then, the parasitic inductor Lwire1 may generate a reflected wave at a point between the transmission line Linb4 on input side and the termination resistor R1, when the input signal travels from the input terminal Tinb to the termination resistor R1 through the transmission lines Linb1 to Linb4 on input side (the first input-side transmission line). The reflected wave travels through the transmission lines Linb4 to Linb1 on input side (the first input-side transmission line) in a direction opposite to a traveling direction of the input signal. This reflected wave may reach the output terminal Tout by passing through the respective amplification cells 12a to 12d. Here, a place on the transmission lines on input side where the reflected wave is generated is referred to as a reflection surface.

In the circuit in FIG. 14, a voltage Vout(ω) of the output signal in consideration of a reflection coefficient $\Gamma_{11}(\omega)$ in each frequency ω at the point between the transmission line Linb4 on input side and the termination resistor R1 is calculated according to the following equation (1);

$$V_{out}(\omega) = V_{out}e^{j\omega t} + \Gamma_{11}(\omega)\frac{V_{out}}{n}\{e^{j\omega(t-2d)} + e^{j\omega(t-4d)} + \ldots + e^{j\omega(t-2nd)}\} \quad (1)$$

wherein frequency characteristics of the respective amplification cells 12a to 12d and the transmission lines Linb1 to Linb4, Lout1 to Lout4 are ignored, $V_{out}$ is a voltage of an output signal without reflection, n indicates the number of amplification cells (integer greater than 2), and d indicates a delay time of each of the transmission lines Linb1 to Linb4 on input side, Lout1 to Lout4. The first term of the equation (1) is a term of the output voltage in a case where the reflected wave does not exist, and the second term thereof is a term of the signal where the reflected waves pass through the respective amplification cells and reach the output terminal Tout.

Figure 15A:
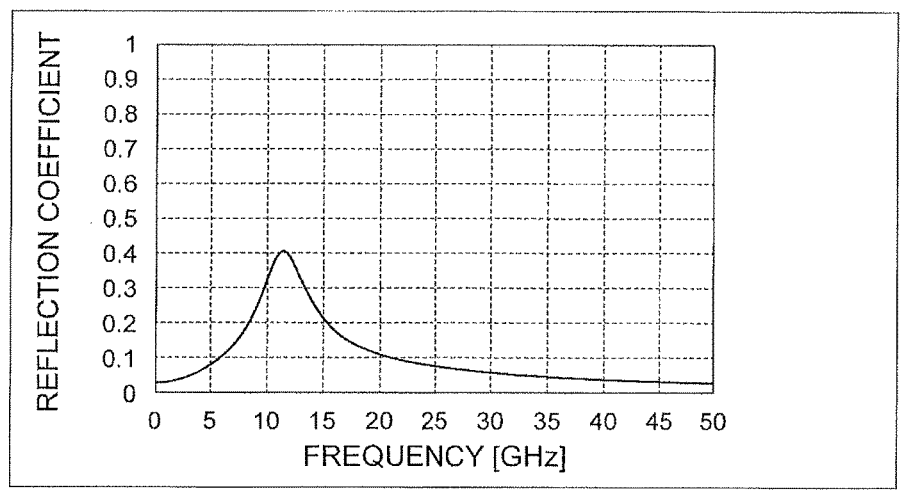
FIG. 15A is a graph illustrating a simulation result of a reflection coefficient of the traveling wave amplifier in FIG. 14.
Figure 15B:
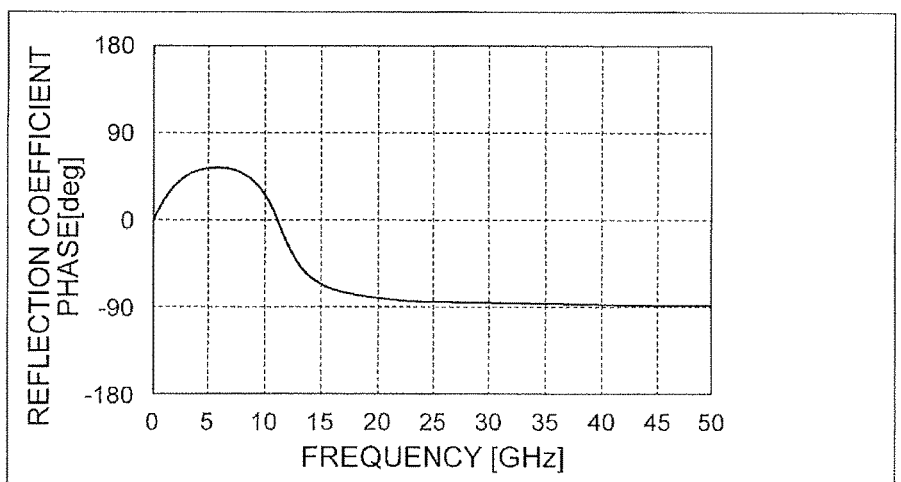
FIG. 15B is a graph illustrating a simulation result of the reflection coefficient of the traveling wave amplifier in FIG. 14.

FIGS. 15A and 15B are graphs illustrating simulation results of the reflection coefficient $\Gamma_{11}(\omega)$ of the TWA 910. FIG. 15A illustrates a frequency characteristic of an amplitude component of the reflection coefficient, and FIG. 15B illustrates a frequency characteristic of a phase component of the reflection coefficient. In this case, it is assumed that a capacitance of the capacitive element C1 is 1 pF and that an inductance of the parasitic inductor Lwire1 is 0.2 nH. The amplitude component of the reflection coefficient $\Gamma_{11}$ (FIG. 15A) is relatively high in the frequency range from 10 to 15 GHz, and the phase component of the reflection coefficient $\Gamma_{11}$ (FIG. 15B) also changes in the same frequency range. For example, the phase of the reflection coefficient $\Gamma_{11}$ is delayed 70 deg at the frequency of 15 GHz, and this phase delay corresponds to a delay time of 13 ps. As expressed in the second term in the equation (1), components of the reflected waves reach the output terminal Tout with respective delays. Here, in a case where it is assumed that the delay time d is 2.5 ps and the number n of amplification cells is 7, the signal with the largest delay has a delay time of 35 ps. Further, as described above, the delay time of the reflected wave to the traveling wave (the input signal) on the reflection surface is 13 ps in the frequency of 15 GHz, and the sum of these delay times is 43 ps. This is larger than the delay time 33 ps corresponding to 180° in a sinusoidal signal having a frequency of 15 GHz. Accordingly, the signal components in the first term and the second term in the equation (1) interfere with each other and generate a bump (non-flatness) in the frequency characteristic.

Figure 16A:
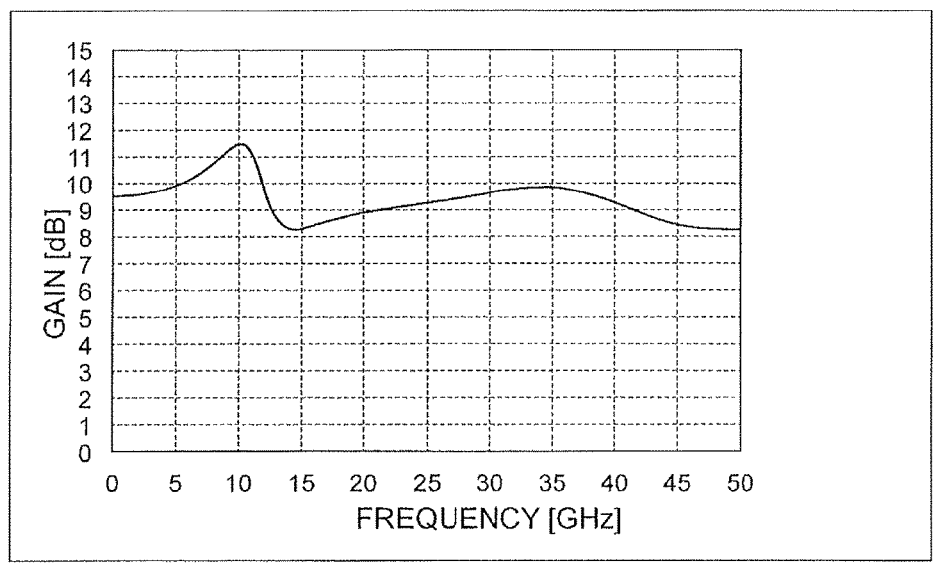
FIG. 16A is a graph illustrating a simulation result of a frequency characteristic of a gain of the traveling wave amplifier in FIG. 14.
Figure 16B:
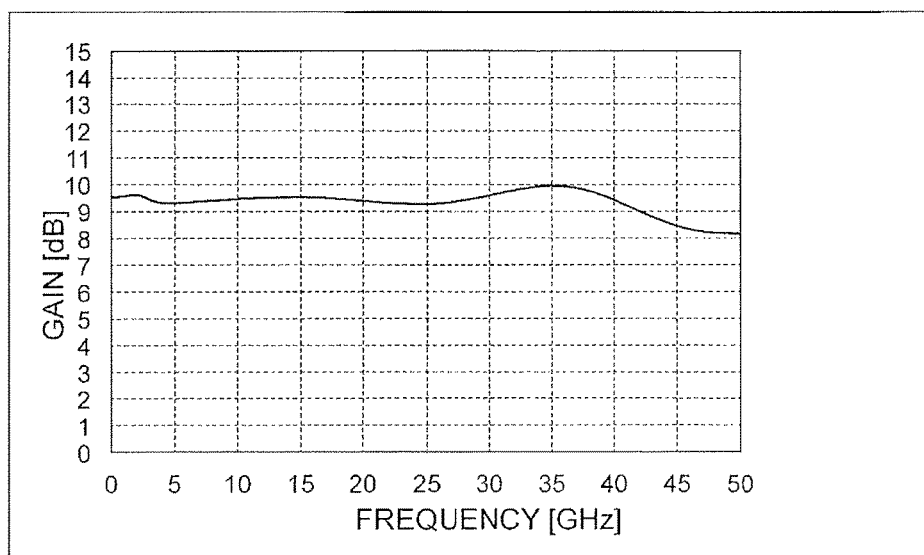
FIG. 16B is a graph illustrating a simulation result of the frequency characteristic of the gain of the traveling wave amplifier in FIG. 14.

FIGS. 16A and 16B illustrate simulation results about frequency characteristics of gains of the TWA 910 in FIG. 14. FIG. 16A illustrates a case where the number n of amplification cells is 7, a delay time d of the transmission line is 2.5 ps, an inductance of Lwire1 is 0.2 nH, and a capacitance of C1 is 1 pF. In this way, an effect of the reflected wave generated by the parasitic inductor Lwire1 appears in the frequency range from 10 to 15 GHz, a bump having a peak and a bottom is generated by interference of the input signal (the traveling wave) and the reflected signal (the reflected wave) on the first input-side transmission line. Generally, in a case where the frequency characteristic has only a peak, the frequency characteristic can be corrected by using a narrow-band filter. However, it is difficult to cancel the bump having both of the peak and the bottom. FIG. 16B illustrates a simulation result in a case where the capacitance of the capacitive element C1 is 20 pF. The bump can be suppressed by setting capacitance of the capacitive element C1 for 10 pF or more in this way. However, a large area is required when the capacitance of 20 pF is formed on an IC. For example, in a case where a capacitance per unit area is 0.4 fF/μm², a circuit area of 5×10⁴ μm² is required, thereby leading to an increase in cost of an IC chip.

[Configuration of the Preferred Embodiment]

Next, a configuration of a traveling wave amplifier according to an embodiment of the present invention will be described.

FIG. 1 is a circuit diagram of a traveling wave amplifier (TWA) 10 according to the embodiment. The TWA 10 according to the embodiment further includes an input terminal Tin, transmission lines Lin1 to Lin4 on input side (a second input-side transmission line), capacitive elements Ca1 to Ca4, and a termination resistor R11 in comparison with the configuration of the TWA 910 in FIG. 11.

The input terminal Tin is a terminal for receiving a positive-phase input signal which has a phase opposite to a phase of the negative-phase input signal input to an input terminal Tinb (an input port of the first input-side transmission line). In the TWA 10 according to the embodiment of the present invention, the input terminals Tin, Tinb receive a differential input signal that is constituted by the positive-phase input signal and negative-phase input signal. The negative-phase input signal input to the input terminal Tinb according to the embodiment of the present invention corresponds to the input signal input to the input terminal Tinb according to the comparative example. The differential input signal is, for example, a pulse voltage signal and includes frequency components of up to 40 GHz or 50 GHz.

The transmission lines Lin1 to Lin4 on input side are configured so that the four transmission lines Lin1, lin2, Lin3, Lin4 are connected in cascade in that order. One end of the transmission line Lin1 on input side is connected with the input terminal Tin to transmit the positive-phase input signal input to the input terminal Tin inside the TWA 10. The respective input-side transmission lines Lin1 to Lin4 can be configured by, for example, coplanar lines. However, a type of the transmission line is not particularly limited.

The input terminal Tin is connected with ground via the capacitive element Ca1. One end of the transmission line Lin1 on input side is connected with the input terminal Tin, and another end of the transmission line Lin1 on input side is connected with the ground via the capacitive element Ca2. One end of the transmission line Lin2 on input side is connected with the other end of the transmission line Lin1 on input side, and another end of the transmission line Lin2 on input side is connected with the ground via the capacitive element Ca3. One end of the transmission line Lin3 on input side is connected with the other end of the transmission line Lin2 on input side, and another end of the transmission line Lin3 on input side is connected with the ground via the capacitive element Ca4. One end of the transmission line Lin4 on input side is connected with the other end of the transmission line Lin3 on input side, and another end of the transmission line Lin4 on input side is connected with one end of the termination resistor R11. Another end of the termination resistor R11 is connected with the other end of a termination resistor R1, and is connected with the ground via a capacitive element C1 for stabilizing a termination potential of the transmission lines Lin1 to Lin4 on input side (the second input-side transmission line). Further, the other end of the termination resistor R11 is also connected with a voltage control terminal Tcon.

The transmission lines Lin1 to Lin4 on input side have respective characteristic impedances and delays substantially identical to the respective characteristic impedances and delays that the input-side transmission lines Linb1 to Linb4 on input side have, respectively. Capacitances of the capacitive elements Ca1 to Ca4 are respectively set equal to input capacitances (capacitances of the input nodes) of the amplification cells 12a to 12d. For example, the capacitances of the capacitive elements Ca1 to Ca4 are set for 10 fF to 100 fF. In other words, in addition to some transmission lines on input side having the same characteristics as the characteristics of the transmission lines Linb1 to Linb4 on input side, the capacitive elements Ca1 to Ca4 having capacitances substantially equivalent to the respective input capacitances of the amplification cells 12a to 12d are additionally connected with the transmission lines on input side. More specifically, the transmission lines Lin1 to Lin4 on input side constituting the second input-side transmission line include some transmission lines having the same configurations as the transmission lines Linb1 to Linb4 on input side constituting the first input-side transmission line and the capacitive elements Ca1 to Ca4 added to the transmission lines Linb1 to Linb4 on input side (the first input-side transmission line). This configuration allows the transmission lines Lin1 to Lin4 on input side to have the characteristics (for example, characteristic impedance and delay) equivalent to the characteristics (for example, characteristic impedance and delay) of the transmission lines in which the input capacitances of the amplification cells 12a to 12d are added to the transmission lines Linb1 to Linb4 on input side, respectively.

Figure 2:
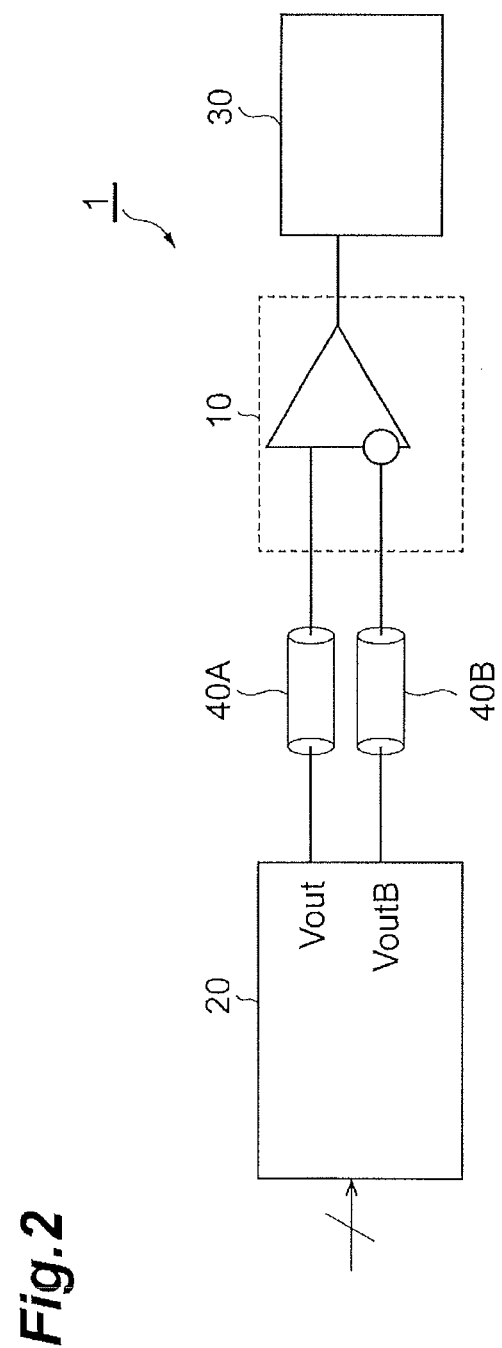
FIG. 2 is a block diagram illustrating a schematic configuration of an optical transmitter module which includes the traveling wave amplifier in FIG. 1.

FIG. 2 is a block diagram illustrating a configuration of an optical transmitter module 1, which includes the TWA 10 described above. As illustrated in FIG. 2, the optical transmitter module 1 includes the TWA 10, a D/A converter 20, and an optical modulator 30. The optical transmitter module 1 is, for example, used for optical communication. According to a digital signal input from an external host device or the like, the D/A converter 20 generates two complementary voltage signals Vout, VoutB having phases opposite to each other and serving as analog signals. The optical modulator 30 is, for example, an EAM or an MZM, and modulates an optical signal (CW light) output from a light source, such as a semiconductor laser diode (not illustrated). The complementary signals Vout, VoutB output from the D/A converter 20 are input to the TWA as a positive-phase input signal and a negative-phase signal via transmission lines 40A, 40B, respectively. The TWA 10 operates, for example, as a driver for the optical modulator 30.

The optical transmitter module 1 is used in a multi-level modulation system, such as PAM4 or 16QAM. This configuration enables the optical transmitter module 1 to perform communication faster than a conventional module mainly that has been used in, for example, a binary modulation system.

According to such a TWA 10, the negative-phase input signal input from the input terminal Tinb is amplified and output as output signal from the output terminal Tout by passing through transmission lines Linb1 to Linb4 on input side (the first input-side transmission line), the amplification cells 12a to 12d, and the transmission lines Lout2 to Lout4 on output side (output-side transmission line). At the same time, the positive-phase input signal complementary to the negative-phase input signal is input to the transmission lines Lin1 to Lin4 on input s-de (the second input-side transmission line) from the input terminal Tin and transmitted. Further, the termination resistor R1 which terminates the transmission lines Linb1 to Linb4 on input side and the termination resistor R11 which terminates the transmission lines Lin1 to Lin4 on input side are connected with each other. This configuration enables the termination potential at a node between the termination resistors R1, R11 to be further stabilized, and reflection of the positive-phase input signal at the node to be suppressed. As a result, while an increase in an area of the circuit of the TWA 10 is prevented, a frequency characteristic of a gain may be flat up to high frequencies. Further, in the above-described TWA 10, the capacitive components respectively corresponding to the capacitive components of the amplification cell group 12 are added to the transmission lines Lin1 to Lin4 on input side in addition to the transmission lines on input side having the same characteristics as the characteristics of the transmission lines Linb1 to Linb4 on input side. This configuration enables an impedance of the transmission lines Lin1 to Lin4 on input side (the second input-side transmission line) to match with a combined impedance of the input-side transmission lines Linb1 to Linb4 on input side (the first input-side transmission line) and the amplification cell group 12, and the gain characteristic to have flatness up to higher frequencies.

Specifically, reflection at the end part of the transmission lines Linb1 to Linb4 on input side may be suppressed without increasing capacitance of the capacitive element C1. For example, in order to set capacitance of the capacitive element C1 for 20 pF, a circuit area of 50,000 μm² is required. On the other hand, adding the transmission lines Lin1 to Lin4 on input side (the second input-side transmission line) and the capacitive elements Ca1 to Ca4 as in the present embodiment, for example, causes an increase in the circuit area of about 38,000 μm². As a result, the circuit area required for improving the frequency characteristics of the gain may be reduced by 20% or more. This is because, the capacitive element C1 formed on a rectangle area having a small aspect ratio (e.g., a square) needs a larger area than the transmission line formed of a rectangle area elongated in one direction having a large aspect ratio. Therefore, the TWA 10 according to the embodiment of the present invention has an advantage for downsizing.

Here, the reflected wave at the end part of the transmission lines Linb1 to Linb4 on input side is evaluated. Signal voltages $V_{R1}(\omega)$, $V_{R11}(\omega)$ respectively applied to the termination resistor R1 and the termination resistor R11 are expressed in the following equations (2), (3).

$$V_{R1}(\omega) = V_{r1} \cdot e^{j\omega t} \qquad (2)$$

$$V_{R11}(\omega) = -V_{r1} \cdot e^{j\omega(t+tskw)} \qquad (3)$$

Supposed that a skew tskw (a phase difference) between the positive-phase input signal input to the input terminal Tin and the negative-phase input signal input to the input terminal Tinb, is caused by performance of the D/A converter 20 and characteristics of the transmission lines 40A, 40B in FIG. 2. When the termination resistors R1, R11 have an identical resistance, an in-phase component thereof is calculated according to the following equation (4);

$$V_{R1}(\omega)+V_{R11}(\omega)=V_{r1}\cdot e^{j\omega t}(1-e^{j\omega tskw}) \quad (4)$$

The reflected wave generated at the end part of the transmission lines Linb1 to Linb4 on input side has a voltage obtained by multiplying the above-described equation (4) by the reflection coefficient. Therefore, if the skew tskw is less than 3 ps, ωxtskw<32° in the frequency of 30 GHz and the value in the equation (4) becomes sufficiently small to a negligible extent. Thus, the reflected wave may be sufficiently suppressed in the TWA 10 according to the embodiment of the present embodiment. In other words, the reflected wave generated from the negative-phase input signal at the end part of the first input-side transmission line is canceled by the reflected wave generated from the positive-phase input signal at the end part of the second input-side transmission line, because the two reflected waves have opposite phase to each other and superposed to each other at the node between the termination resistors R1, R11.

Figure 3A:
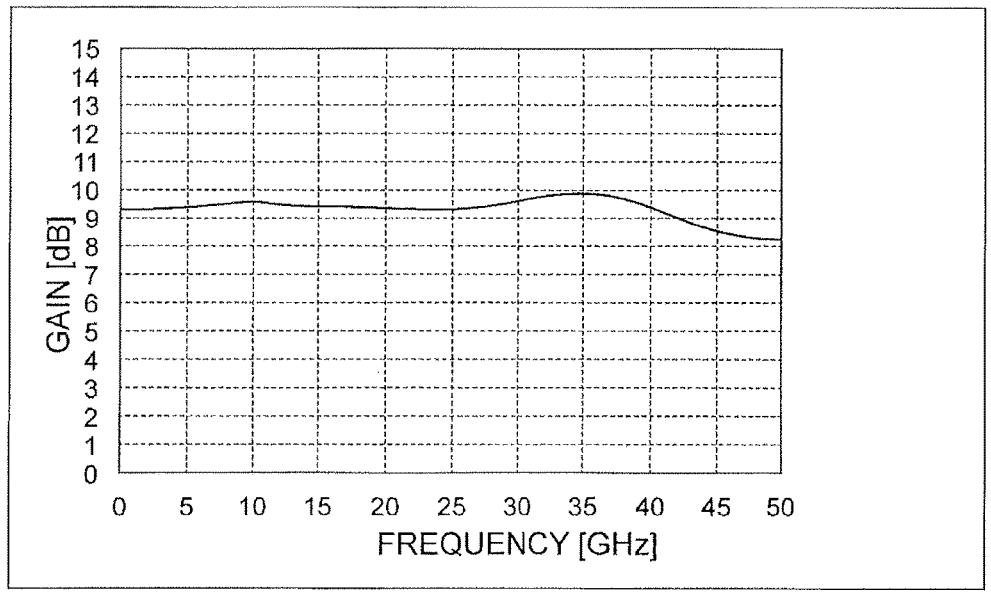
FIG. 3A is a graph illustrating a simulation result of a frequency characteristic of a gain of the traveling wave amplifier in FIG. 1.
Figure 3B:
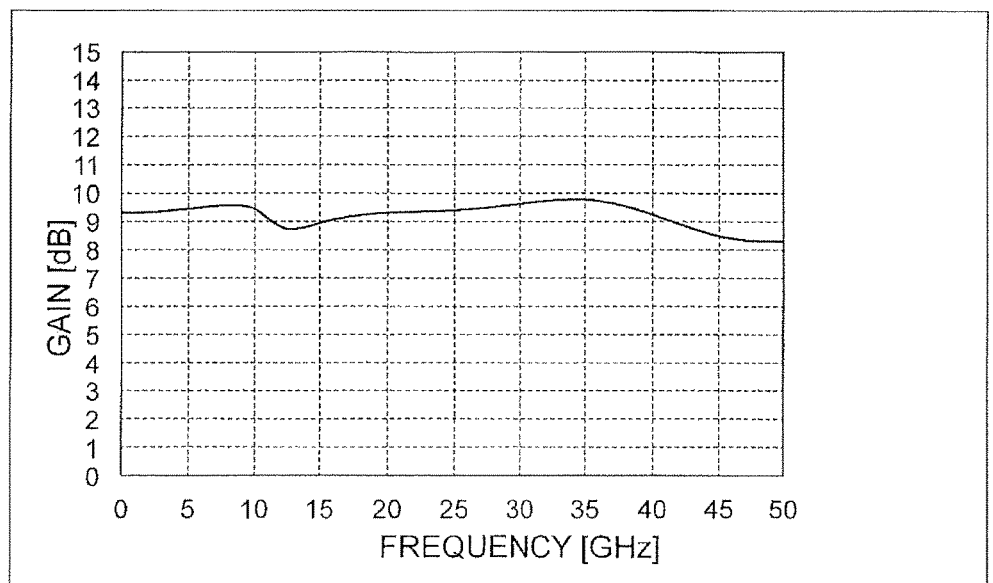
FIG. 3B is a graph illustrating a simulation result of a frequency characteristic of a gain of the traveling wave amplifier in FIG. 1.

FIGS. 3A and 3B illustrate simulation results of frequency characteristics of gain of the TWA 10 in FIG. 1. FIG. 3A illustrates a case where the number n of amplification cells, the input capacitance of each amplification cell, the capacitance of each of the capacitive elements added to the transmission lines on the input terminal Tin side corresponding to the amplification cells are set for 7, 25 fF, and 25 fF, respectively. In this way, a bump of the gain in the frequency range from 10 GHz to 15 GHz is sufficiently suppressed. In contrast with FIG. 3A, FIG. 3B illustrates the simulation result of a case where the capacitance of each of the capacitive elements added to the transmission lines of input side on the input terminal Tin side is set to 0 fF. In this case, a delay time of the transmission lines on the input terminal Tin side and an impedance of the transmission lines on input side do not match with a delay time of the transmission lines formed of the sum of the transmission lines on the input terminal Tinb side and the input capacitance of the amplification cell group and an impedance of the input-side transmission lines, respectively. Accordingly, the bump in the frequency characteristic of the gain is not sufficiently suppressed.

As described above, principles of the present invention have been illustrated and described in the preferred embodiment. It should be recognized that a person skilled in the art arrives other arrangements and variations from the embodiment without departing from such principles. The present invention is not limited to a specific configuration disclosed in the present embodiment. Therefore, a right is claimed in entire modifications and changes derived from the claims and the spirit thereof.

Figure 4:
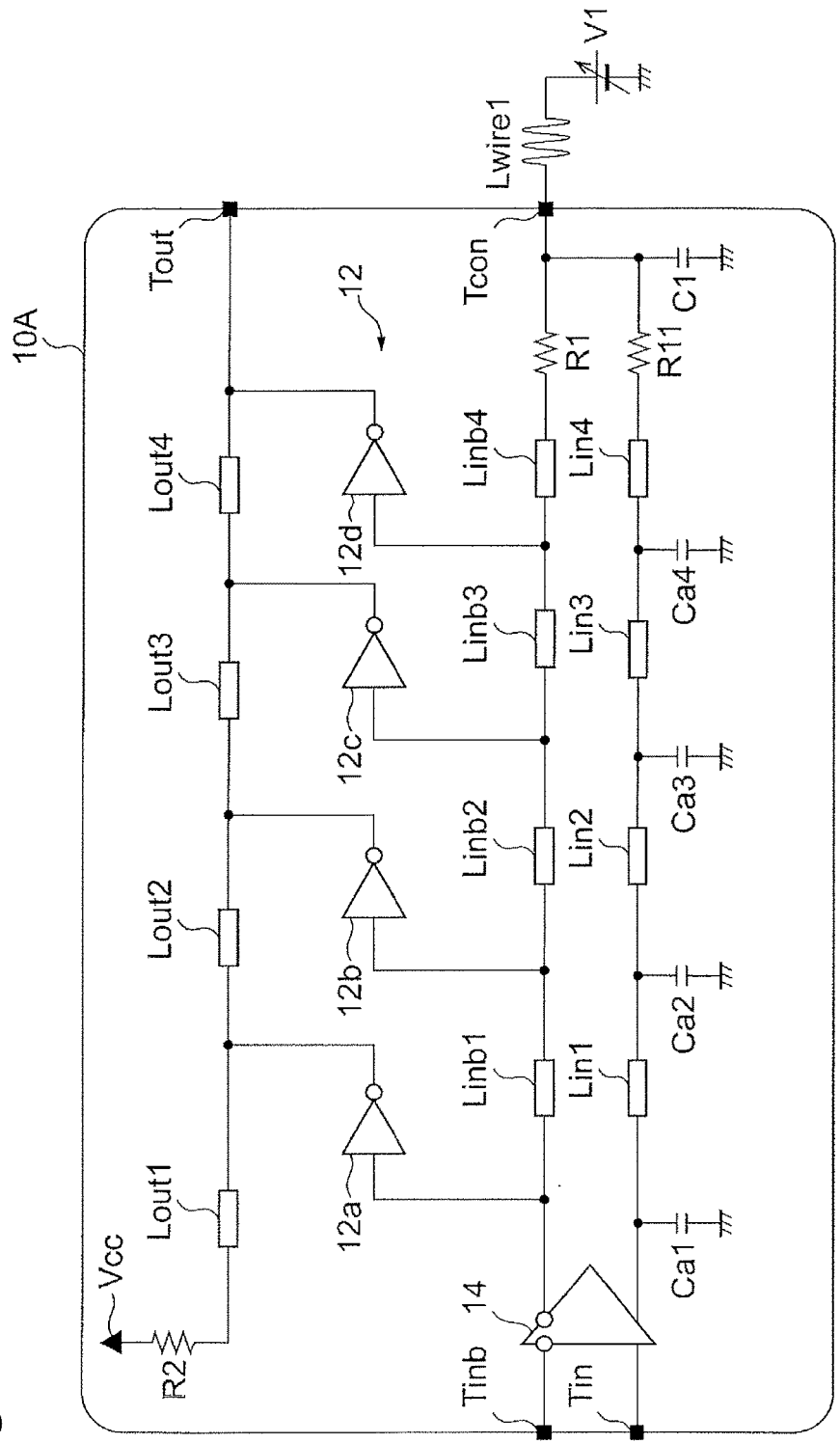
FIG. 4 is a circuit diagram of a traveling wave amplifier according to a variation of the preferred embodiment of the present invention.

For example, the TWA in the present embodiment may have a configuration illustrated in FIG. 4. In a traveling wave amplifier 10A illustrated in FIG. 4, a pre-buffer amplifier 14 is added to the TWA 10. The pre-buffer amplifier 14 is a differential-type amplifier having a pair of differential input terminals and a pair of differential output terminals, and is inserted between two input terminals Tinb, Tin and two transmission lines Linb1, Lin1 on input side. The pre-buffer amplifier 14 amplifies the differential input signal (a positive-phase input signal and a negative-phase input signal) input to the pair of differential input terminals Tin, Tinb, and outputs the amplified differential input signal from the pair of differential output terminals as differential output signals (a positive-phase output signal and a negative-phase output signal). The positive-phase input signal and the negative-phase input signal are complementary input signals having phases different from each other by 180°. Further, the positive-phase output signal and the negative-phase output signal are complementary output signals having phases different from each other by 180°. More specifically, the pre-buffer amplifier 14 outputs the negative-phase output signal and the positive-phase output signal to the transmission line Linb1 and the input-side transmission line Lin1, respectively. An output skew (a phase difference) between the positive-phase output signal and the negative-phase output signal of the pre-buffer amplifier 14 is set for 3 ps or less. The configuration enables the TWA to sufficiently suppress a bump in a frequency characteristic of a gain at high frequencies of 1 GHz or more. Further, providing such a pre-buffer amplifier 14 enables the TWA to sufficiently amplify the input signal and output the amplified signal with a large amplitude, even when an amplitude of the input signal is small. A driving signal with large amplitude is preferable for driving the optical modulator. Further, even when a differential input signal having a large skew is input, the pre-buffer enables the TWA to reduce the skew in the differential output signal.

Figure 5:
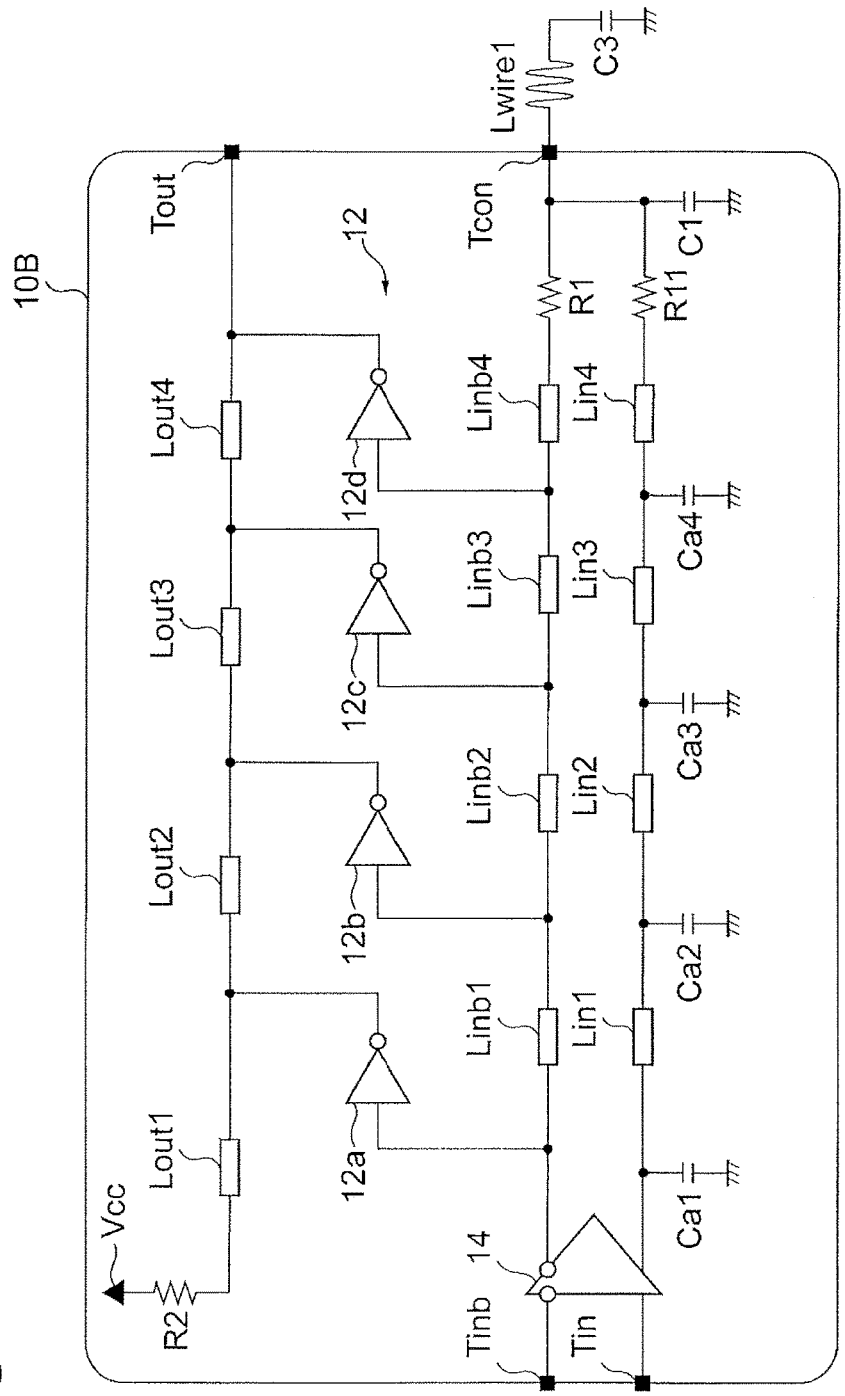
FIG. 5 is a circuit diagram of a traveling wave amplifier according to another variation of the preferred embodiment of the present invention.

Further, In a TWA 10B illustrated in FIG. 5, a pre-buffer amplifier 14 may adjust a DC potential of a differential output signal and a capacitive element C3 may be connected with a voltage control terminal Tcon. The capacitive element C3 is set for a large capacitance of about 100 pF to 10 nF and has a low impedance like that of the DC power supply V1 at high frequencies of 1 GHz or more. The configuration also enables the TWA 10B to reduce a bump in a frequency characteristic of a gain at a high frequencies of 1 GHz or more. Further, as compared with a case of only the capacitive element C1, the capacitive element C3 enables the TWA to flatten the frequency characteristic of a gain at lower frequencies. Further, the capacitive element C3 enables the TWA to reduce an in-phase signal component output from the pre-buffer amplifier 14. However, when the in-phase signal component output from the pre-buffer amplifier 14 is sufficiently small, the capacitive element C3 and a parasitic inductor Lwire1 may be omitted (The voltage control terminal Tcon is opened).

Figure 6:
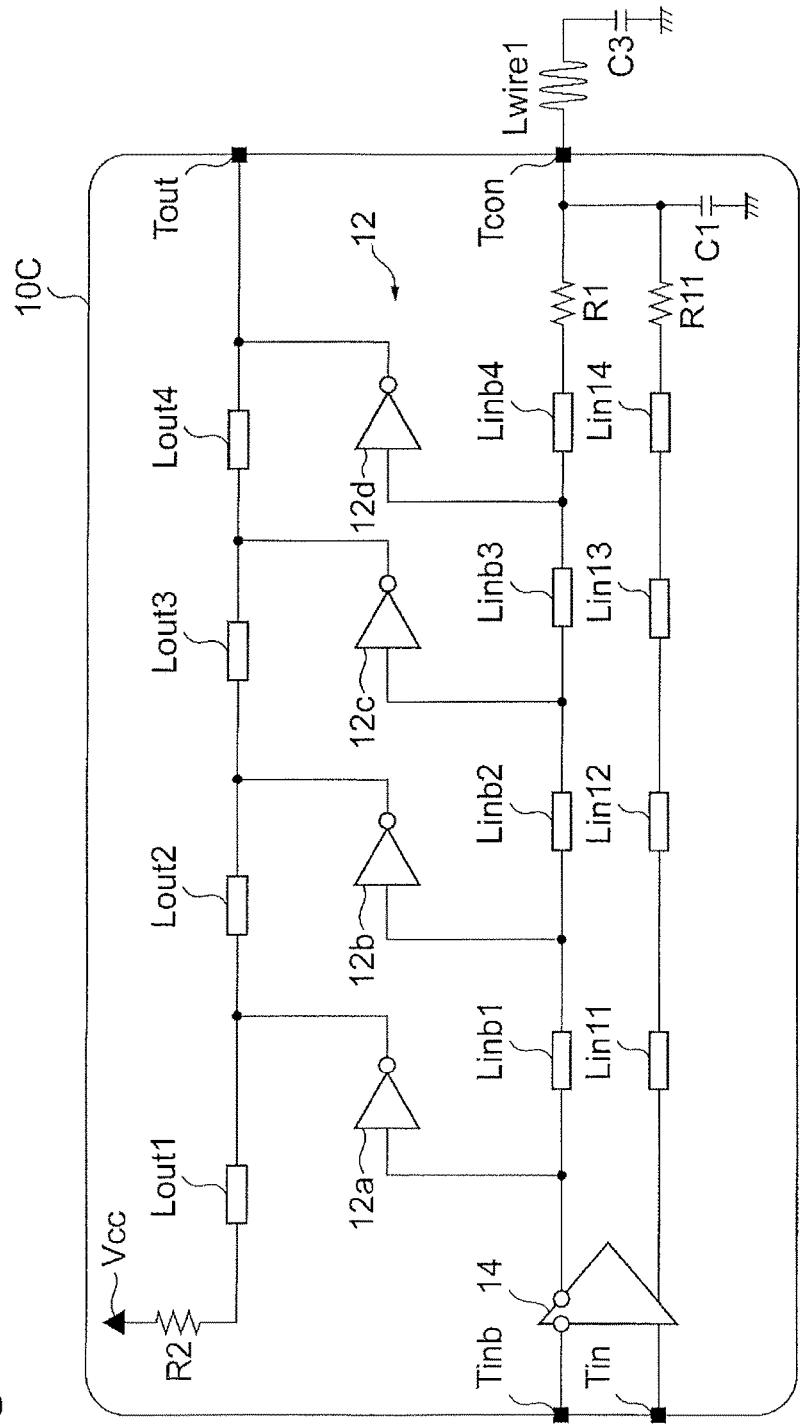
FIG. 6 is a circuit diagram of a traveling wave amplifier according to still another variation of the preferred embodiment of the present invention.

Further, in a TWA 10C illustrated in FIG. 6, the transmission lines Lin11 to Lin14 on input side where capacitive elements Ca1 to Ca4 have been equivalently added to inside the adjacent transmission lines thereof, respectively, may be used instead of the transmission lines Lin1 to Lin4 on input side. Capacitances of capacitive components added to the respective transmission lines Lin11 to Lin14 on input side are set substantially equal to input capacitances of amplification cells 12a to 12d. With such a configuration as well, a bump in a frequency characteristic of a gain at high frequencies of 1 GHz or more is sufficiently suppressed.

Figure 7A:
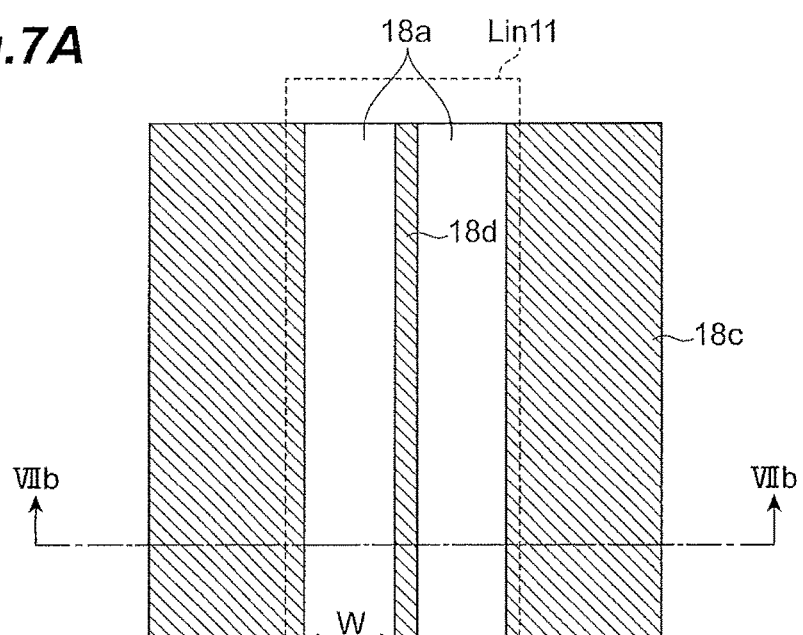
FIG. 7A is a diagram illustrating an example of a structure of a transmission line Lin11 on input side in FIG. 6.
Figure 7B:
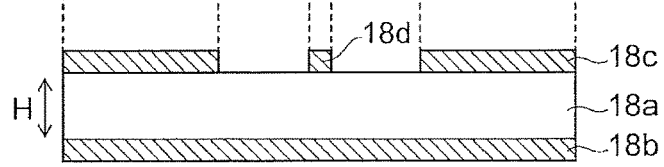
FIG. 7B is a diagram illustrating an example of a structure of the transmission line Lin11 on input side in FIG. 6.

FIGS. 7A and 7B are diagrams illustrating one example of a structure of the transmission line Lin11 on input side. FIG. 7A is a plan view of the transmission line Lin11 on input side, and FIG. 7B is a sectional view taken along a line VIIb-VIIb in FIG. 7A. As illustrated in these diagrams, the transmission line Lin11 on input side includes a substrate 18a, a lower metal film 18b, an upper metal film 18c, and a wiring line 18d. An insulator, such as a SiON or BCB film, or a semiconductor substrate, such as InP, GaAs, or Si, is used for the substrate 18a. The lower metal film 18b is formed in contact with a first surface of the substrate 18*a* so as to cover the first surface. The upper metal film 18*c* is formed in contact with a second surface of the substrate 18*a* so as to cover the second surface other than a strip-shaped region (an opening part and the wiring line 18*d*). In a center of the opening part on the second surface of the substrate 18*a*, the wiring line 18*d* is formed linearly in contact with the second surface. These metal films 18*b*, 18*c* are wiring lines for ground connection (ground wiring lines), and the wiring line 18*d* is a wiring line for connection with a wiring line on the input terminal Tin side. The metal film 18*c* and the wiring line 18*d* are adjacently formed with a distance W in between. The transmission line Lin11 on input side having such a structure provides an adjustable capacitive component included in the transmission line on input side by changing thickness H of the substrate 18*a* or the distance W between the upper metal film 18*c* and the wiring line 18*d*. The transmission lines Lin12 to Lin14 and Linb1 to Linb4 on input side may also have similar structures. Moreover, in the transmission lines Lin11 to Lin14 on input side (the second input-side transmission line), each distance W is set shorter than each distance W of the transmission lines Linb1 to Linb4 on input side (the first input-side transmission line). Accordingly, as mentioned above, the respective capacitive components of the capacitive elements Ca1 to Ca4 may be equivalently added to capacitive components of the adjacent transmission lines Linb1 to Linb4 on input side.

Figure 8:
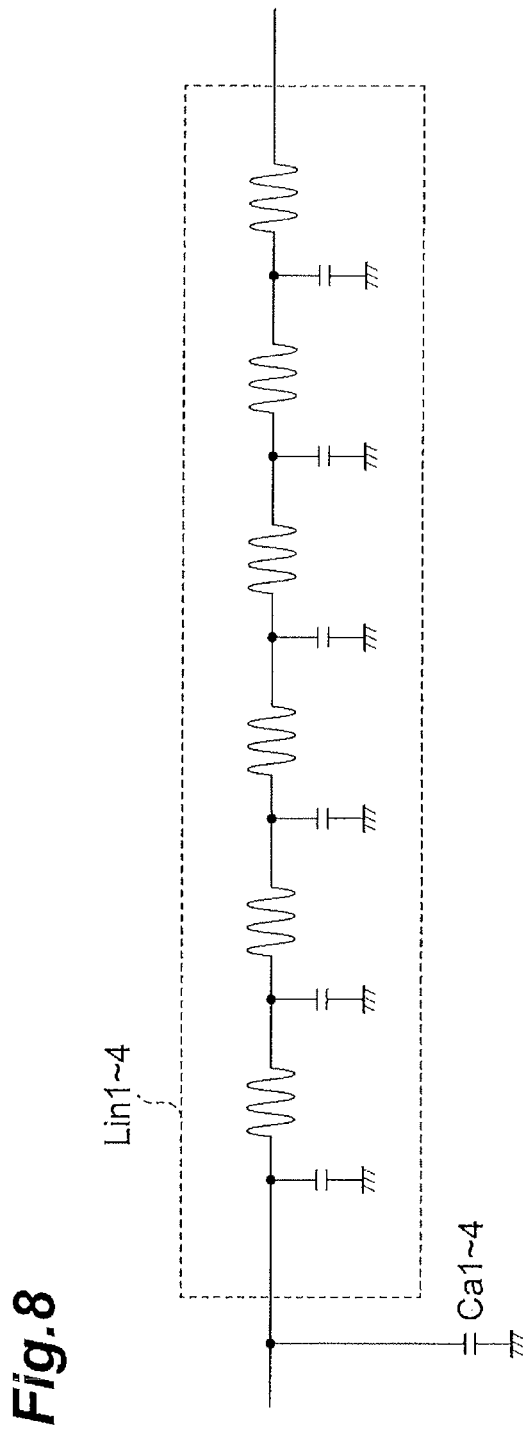
FIG. 8 is an equivalent circuit diagram of transmission lines on input side of the traveling wave amplifier.

Here, FIG. 8 is a circuit diagram of an equivalent circuit of the transmission lines Lin1 to Lin4 on input side of the TWA 10, 10A, 10B. A total value of inductance components of the transmission lines Lin1 to Lin4 on input side is set for, for example, about 10 pH to 100 pH. Further, a total value of capacitance components (capacitive components) of the transmission lines Lin1 to Lin4 on input side is set for, for example, about 5 fF to 100 fF. As a result, a sum of the inductance components and the capacitance components included in the transmission lines Lin1 to Lin4 on input side (the second input-side transmission line) is set so as to correspond to that of the transmission lines Linb1 to Linb4 on input side (the first input-end transmission line). Moreover, a total capacitance of the capacitive elements Ca1 to Ca4 additionally connected with the transmission lines Lin1 to Lin4 on input side (the second input-side transmission line) is set so as to correspond to a sum of the input capacitances of the amplification cells 12*a* to 12*d*.

Figure 9:
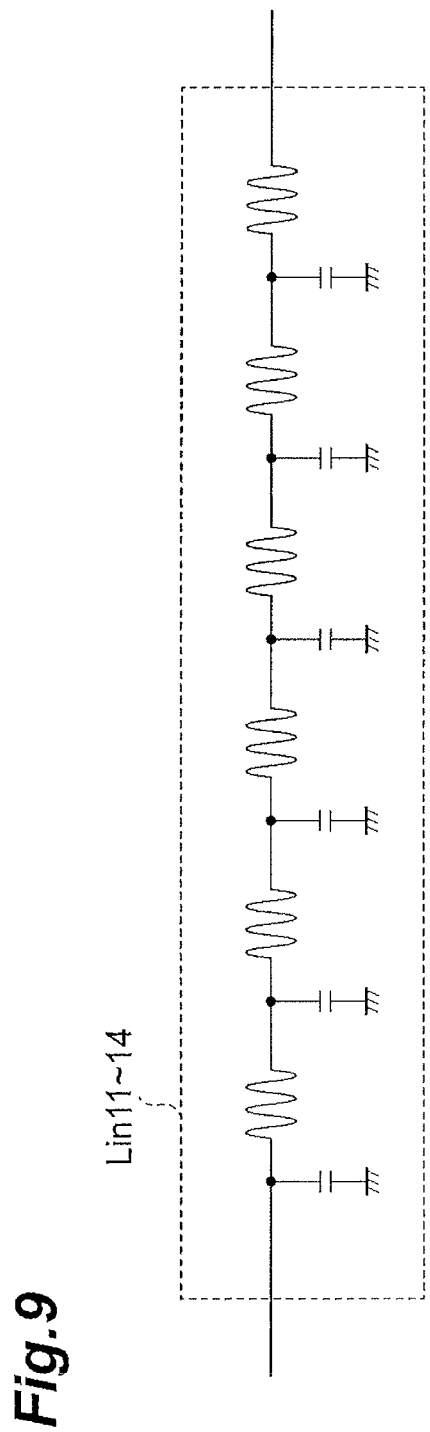
FIG. 9 is an equivalent circuit diagram of transmission lines on input side of the traveling wave amplifier.

Further, FIG. 9 is a circuit diagram of an equivalent circuit of the transmission lines Lin11 to Lin14 on input side of the TWA 10C. A total value of inductance components of the transmission lines Lin11 to Lin14 on input side is set for, for example, about 10 pH to 100 pH. A total value of capacitance components (capacitive components) of the transmission lines Lin11 to Lin14 on input side is set for, for example, about 30 fF to 125 fF. This total value of the capacitance components is set to a value where the input capacitances of the amplification cells 12*a* to 12*d* (about 25 fF) are added to the total value of the capacitance components of the transmission lines Linb1 to Linb4 on input side. Such capacitance components may be adjusted, for example, by reducing the distance W (FIG. 7A) of the input-side transmission lines Lin11 to Lin14.

What is claimed is:

1. A traveling wave amplifier to amplify an input signal and output the amplified input signal as an output signal, comprising:
    a first input terminal configured to receive the input signal;
    a second input terminal configured to receive another input signal having a phase opposite to a phase of the input signal;
    an output terminal configured to output the output signal;
    a first input-side transmission line having a first end connected with the first input terminal and a second end, for transmitting the input signal;
    a second input-side transmission line having a first end connected with the second input terminal and a second end, for transmitting the another input signal;
    an output-side transmission line having a first end connected with the output terminal, for transmitting the output signal;
    a plurality of amplification circuits each having an input node and an output node, the input nodes of the amplification circuits being connected with the first input-side transmission line at first intervals in a predetermined order and receiving parts of the input signal, each of the amplification circuits amplifying a part of the input signal input to the input node thereof and outputting an amplified signal from the output node thereof, the output nodes of the amplification circuits being connected with the output-side transmission line at second intervals in a predetermined order and generating the output signal;
    a first resistive element having a first end connected with the second end of the first input-side transmission line and a second end; and
    a second resistive element having a first end connected with the second end of the second input-side transmission line and a second end connected with the second end of the first resistive element.

2. The traveling wave amplifier according to claim 1, wherein the second input-side transmission line includes capacitors and a transmission line, each of the capacitors having a capacitance substantially equivalent to a capacitance of the respective input nodes of the amplification circuits, the second input-side transmission line having a characteristic impedance substantially equal to a characteristic impedance of the first input-side transmission line and a delay substantially equal to a delay of the first input-side transmission line.

3. The traveling wave amplifier according to claim 2, wherein the number of capacitors is equal to the number of amplification circuits and the capacitors are connected with the second input-side transmission line at the first intervals.

4. The traveling wave amplifier according to claim 1,
    wherein the first input-side transmission line includes a first signal wiring line for transmitting the input signal, and a first ground wiring line adjacent to the first signal wiring line, the first input-side transmission line having a first distance between the first signal wiring line and the first ground wiring line,
    wherein the second input-side transmission line includes a second signal wiring line for transmitting the another input signal, and a second ground wiring line adjacent to the second signal wiring line, the second input-side transmission line having a second distance between the second signal wiring line and the second ground wiring line, and
    wherein the second distance is shorter than the first distance.

5. The traveling wave amplifier according to claim 1, further including a termination capacitor,
    wherein the second end of the first resistive element and the second end of the second resistive element are grounded through the termination capacitor.

6. The traveling wave amplifier according to claim 1, wherein the plurality of amplification circuits is arranged in a row from the first input terminal and the second input terminal to the output terminal, the input node of each of the amplification circuits being connected with the first input-side transmission line according to the predetermined order and the row.

7. The traveling wave amplifier according to claim 1,
   wherein each of the amplification circuits further includes an emitter follower and a single-ended amplification circuit for amplifying a single-ended signal,
   wherein the single-ended signal is input to the input node and is input to the single-ended amplification circuit through the emitter follower, and
   wherein the single-ended amplification circuit amplifies the single-ended signal input through the emitter follower and outputs the amplified signal from the output node.

8. The traveling wave amplifier according to claim 1, further including: a differential amplification circuit configured to receive the input signal and the another input signal and output an amplified signal amplified from the input signal and another amplified signal amplified from the another input signal to the first input-side transmission line and the second input-side transmission line, respectively,
   wherein the differential amplification circuit is between the first input terminal and the first end of the first input-side transmission line and between the second input terminal and the first end of the second input-side transmission line.

* * * * *